United States Patent [19]

Theuwissen

[11] Patent Number: 5,164,807
[45] Date of Patent: Nov. 17, 1992

[54] CHARGE-COUPLED DEVICES WITH LOCALLY WIDENED ELECTRODES

[75] Inventor: Albert J. P. Theuwissen, Eindhoven, Netherlands

[73] Assignee: U.S. Philips Corp., New York, N.Y.

[21] Appl. No.: 782,777

[22] Filed: Oct. 22, 1991

Related U.S. Application Data

[63] Continuation of Ser. No. 595,630, Oct. 5, 1990, abandoned, which is a continuation of Ser. No. 213,961, Jun. 30, 1988, abandoned.

[30] Foreign Application Priority Data

Mar. 15, 1988 [NL] Netherlands .................. 8800627

[51] Int. Cl.$^5$ .............................................. H01L 29/78
[52] U.S. Cl. ...................................... 257/241; 257/222; 257/231; 257/242
[58] Field of Search ............... 357/24 LR, 24 M, 24; 377/61, 62, 63

[56] References Cited

U.S. PATENT DOCUMENTS

| | | | |
|---|---|---|---|
| 3,971,003 | 7/1976 | Kosonocky | 357/24 LR |
| 4,320,363 | 3/1982 | Kaschte | 357/24 |
| 4,353,084 | 10/1982 | Herbst et al. | 357/24 LR |
| 4,376,897 | 3/1983 | Byrne et al. | 357/24 |
| 4,382,193 | 5/1983 | Grueter | 357/24 |
| 4,513,313 | 4/1985 | Kinoshita et al. | 357/24 LR |
| 4,540,901 | 9/1985 | Suzuki | 357/24 LR |
| 4,651,215 | 3/1987 | Bell et al. | 358/213.26 |
| 4,658,278 | 4/1987 | Elabd et al. | 377/62 |
| 4,694,316 | 9/1987 | Chabbal | 357/24 LR |
| 4,807,037 | 2/1989 | Iesaka et al. | 357/24 LR |
| 4,862,235 | 8/1989 | Hayes et al. | 377/61 |

FOREIGN PATENT DOCUMENTS

| | | | |
|---|---|---|---|
| 58-210662 | 12/1983 | Japan | 357/24 |
| 59-34658 | 2/1984 | Japan | 357/24 LR |
| 60-163459 | 8/1985 | Japan | 357/24 LR |
| 60-187054 | 9/1985 | Japan | 357/24 LR |
| 61-40058 | 2/1986 | Japan | 357/24 |

*Primary Examiner*—Andrew J. James
*Assistant Examiner*—Ngan Van Ngo
*Attorney, Agent, or Firm*—Steven R. Biren

[57] ABSTRACT

In CCD arrangements, such as bidimensional image sensors, it is usual to provide the output register in the form of two (or more) horizontal registers. Via transverse connections between the horizontal registers, charge packets are transported from one horizontal register to the other horizontal register. In order to avoid delays during this transverse transport due to narrow channel effects, the clock electrodes of the first horizontal register adjoining the transverse connections are widened at the expense of adjacent clock electrodes. These widened electrodes may be in the trapezoidal form, as a result of which additional drift fields are induced below these electrodes.

4 Claims, 3 Drawing Sheets

CHARGE-COUPLED DEVICES WITH LOCALLY WIDENED ELECTRODES

This is a continuation of application Ser. No. 07/595,630, filed Oct. 5, 1990 which is a continuation of Ser. No. 213,961 filed Jun. 30, 1988 both now abandoned.

BACKGROUND OF THE INVENTION

The invention relates to a charge-coupled device having a semiconductor body comprising at least two charge transport channels, which are defined at a surface, are located beside each other and have parallel charge transport directions and rows of clock electrodes provided on the surface and extending in the longitudinal direction of the charge transport channels for applying clock voltages for controllably storing information representing charge packets in charge storage regions in the charge transport channels and for transporting charge packets from one charge storage region to a next charge storage region, while between the two charge transport channels at least one connection channel is formed, which is limited by channel-limiting regions and through which charge packets can be transferred from one charge storage region in the first charge transport channel to the second charge transport channel.

This device can form part of the horizontal read-out register of a bidimensional charge-coupled image sensor arrangement, for which the invention is of particular importance. These image sensor arrangements comprise a system of vertical charge transport channels, through which charge packets representing image information are transported in parallel in lines to the read-out register. The charge packets are introduced in parallel into the horizontal read-out register in a linewise manner and are then transported through the horizontal read-out register, at whose output they can be read out in series. As is known, preferably two or three adjacent charge transport channels are provided for the horizontal read-out register, the charge packets of an image line being distributed over these two or three transport channels before they are transported to the output. Such an arrangement is known inter alia from the article "High Density Frame Transfer Image Sensor" of Beck et al, published in "Proceedings of the Fourteenth Conference on Solid State Devices", Tokyo 1982, Japanese Journal of Appl. Phys., Vol. 22, (1983), Suppl. 22-1, pp. 109/112. FIG. 5 of this publication shows a horizontal read-out register having three parallel channels.

A charge-coupled device of the kind described above having at least two adjacent charge transport channels and at least one connection channel between these channels can be used not only in bidimensional image sensors, but also in other types of devices, such as, for example, in line sensors. This type of sensor, which may be used, for example, for facsimile applications, essentially comprises one single line of photosensitive elements or pixels. Two (or more) charge transport channels can be provided on either side of the line for reading-out purposes. The pitch between the pixels can then be four times the pitch of the bits in the charge-coupled device, which is often desirable in connection with the resolving power. A charge-coupled device of the kind described above can be used in arrangements only intended for signal processing purposes. Although the invention will be described especially with reference to bidimensional image sensors, it should therefore be taken into account that the invention is not limited to this type of arrangements.

In image sensors of the kind described inter alia in the aforementioned publication, a line of charge packets corresponding to the line pixels of, for example, a T.V. display apparatus is introduced from a memory into the horizontal read-out register. The period of time required for transferring from the parallel section to the horizontal read-out register and for distributing the charge packets over the three horizontal channels is determined by the line fly-back time, which is, for example, 12 $\mu$sec.

It has been found in practice that the distribution of the charge packets over the three horizontal channels is a very critical operation and that at least with the use of the normal clock voltages the period of the line fly-back time is too short, as a result of which the transport efficiency is too low due to the fact that charge is left.

SUMMARY OF THE INVENTION

The invention has inter alia for its object to provided a configuration, by which, while maintaining the other favorable properties, the transport via the connection channels between the charge transport channels is improved.

The invention is based inter alia on the recognition of the fact that the aforementioned transport problems are mainly due to the small width of the connection channels and that, when a specific geometry is chosen for the clock electrodes, the connection channels can be considerably widened.

According to the invention, a charge-coupled device of the kind described above is characterized in that the clock electrode associated with the first charge storage region in the first charge transport channel is wider at least on the side adjoining the connection channel than the clock electrode associated with an adjacent charge storage region in the first charge transport channel.

Due to the fact that the width of the connection channel is correlated to the width of the adjoining side of the clock electrode of the fist charge transport channel, it is possible by increasing the width at the expense of other clock electrodes also to increase locally the width of the connection channel. It has been found that in this manner the transport problems described can be avoided for the major part.

The clock electrode may be rectangular, in which event the opposite side is enlarged to the same extent as the side adjoining the connection channel with respect to other clock electrodes.

A preferred embodiment is characterized in that the clock electrode associated with the first charge storage region has a larger width on the side adjoining the connection channel than on the opposite side. A favorable shape for the clock electrode is a trapezoidal shape. By a varying width, an electric field is produced below the clock electrode, as a result of which the transport of charge stored below the electrode in the direction of the connection channel is favored.

BRIEF DESCRIPTION OF THE DRAWING

The invention will be described more fully with reference to an embodiment and the accompanying diagrammatic drawing, in which.

DESCRIPTION OF THE PREFERRED EMBODIMENTS

Figure 1:
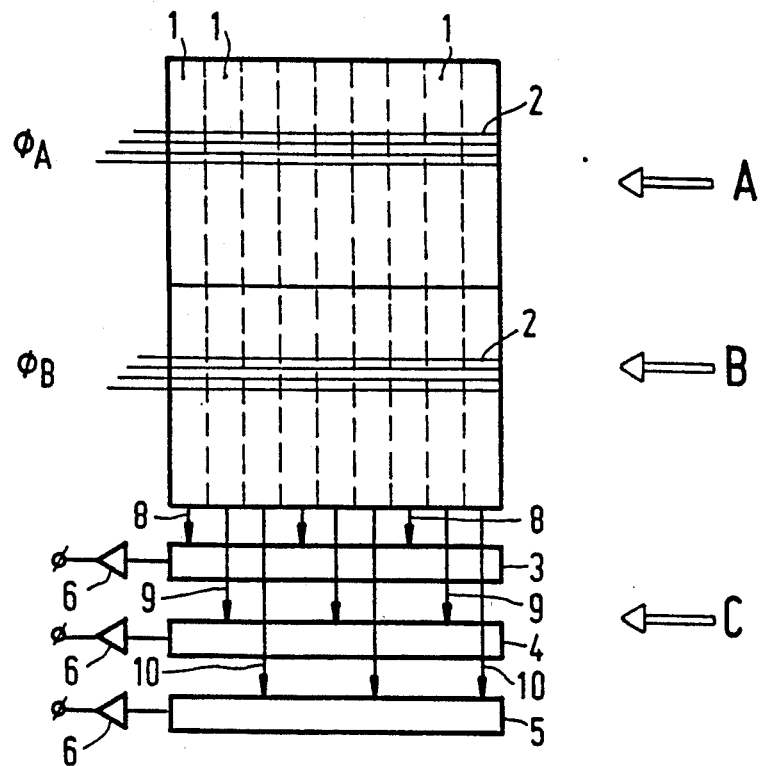
FIG. 1 shows the circuit diagram of an FT sensor comprising three horizontal read-out registers.

The invention will be described more fully with reference to an image sensor arrangement, for which, by way of example, a sensor of the frame transfer type (FT type) is chosen. However, it will be appreciated that the invention may also be used without further expedients in, for example, sensors of the interlaced scanning type. FIG. 1 shows a circuit diagram of an FT sensor. The major part of the sensor is constituted by a large number of adjacent CCD channels 1, whose transport direction extends from top to bottom. The channels 1 are mutually separated by channel-limiting regions indicated by broken lines in the Figure. The system of channels 1 is subdivided into two parts A and B, which represent the sensor section onto which the radiation image to be sensed is projected and the memory section in which the charge pattern generated during an integration period is stored, respectively. Generally, the memory section B is shielded from incident radiation by means of a reflecting layer. The charge storage and the charge transport are controlled by clock voltages $\phi A_i$ and $\phi B_i$, which are applied to clock electrodes 2, which are shown only diagrammatically in the drawing. The suffixes A and B refer to the sensor section and the memory section, respectively. The suffixes i refer to the phase and may have, for example, for a 4-phase CCD the value 1, 2, 3 or 4.

Reading-out takes place by means of the horizontal register C, in which the charge transport is effected from the right to the left. The horizontal register C in this embodiment is composed of three horizontal channels 3, 4 and 5, whose outputs are coupled to an output amplifier 6, at whose output the signals can be derived. Instead of three channels or registers, the horizontal register C may of course also comprise two or four channels, as the case may be. The use of a multiple read-out register C instead of a single register has several advantages. In this connection, more particularly advantages with respect to the technical design can be mentioned, which are obtained due to the fact that the possibility of tuning design parameters of the vertical registers A, B and the horizontal registers C to each other is now improved.

No further details of the sensor section A and of the memory section B will be described here because they are not essential to the invention and may readily be found, if desired, in the generally known literature.

When reading out, a video line of charge packets is transferred from the memory section B to the horizontal read-out register C. The charge packets are distributed over the three channels in such a manner that, for example, the charge packets from the leftmost register 1 and the $4^{th}$, $7^{th}$ etc. registers 1 are stored in the horizontal channel 3 (indicated symbolically by the arrows 8), the charge packets in the $2^{nd}$ register 1 and the $5^{th}$, $8^{th}$ etc. registers 1 are stored in the horizontal channel 4 (arrow 9) and the charge packet from the $3^{rd}$, $6^{th}$, $9^{th}$ etc. register 1 is stored in the horizontal channel 5 (arrow 10). This transport can be carried out in many ways, but they all have in common that the transport 9 to the channel 4 and the transport 10 to the channel 5 should take place via the channel 3 and via the channels 3 and 4, respectively, in a direction transverse to the horizontal main transport direction of these channels. As has already been stated above, it is often difficult to carry out this transverse transport within the given time limits, which often means in practice that charge is left, as a result of which the transport efficiency is low.

Figure 2:
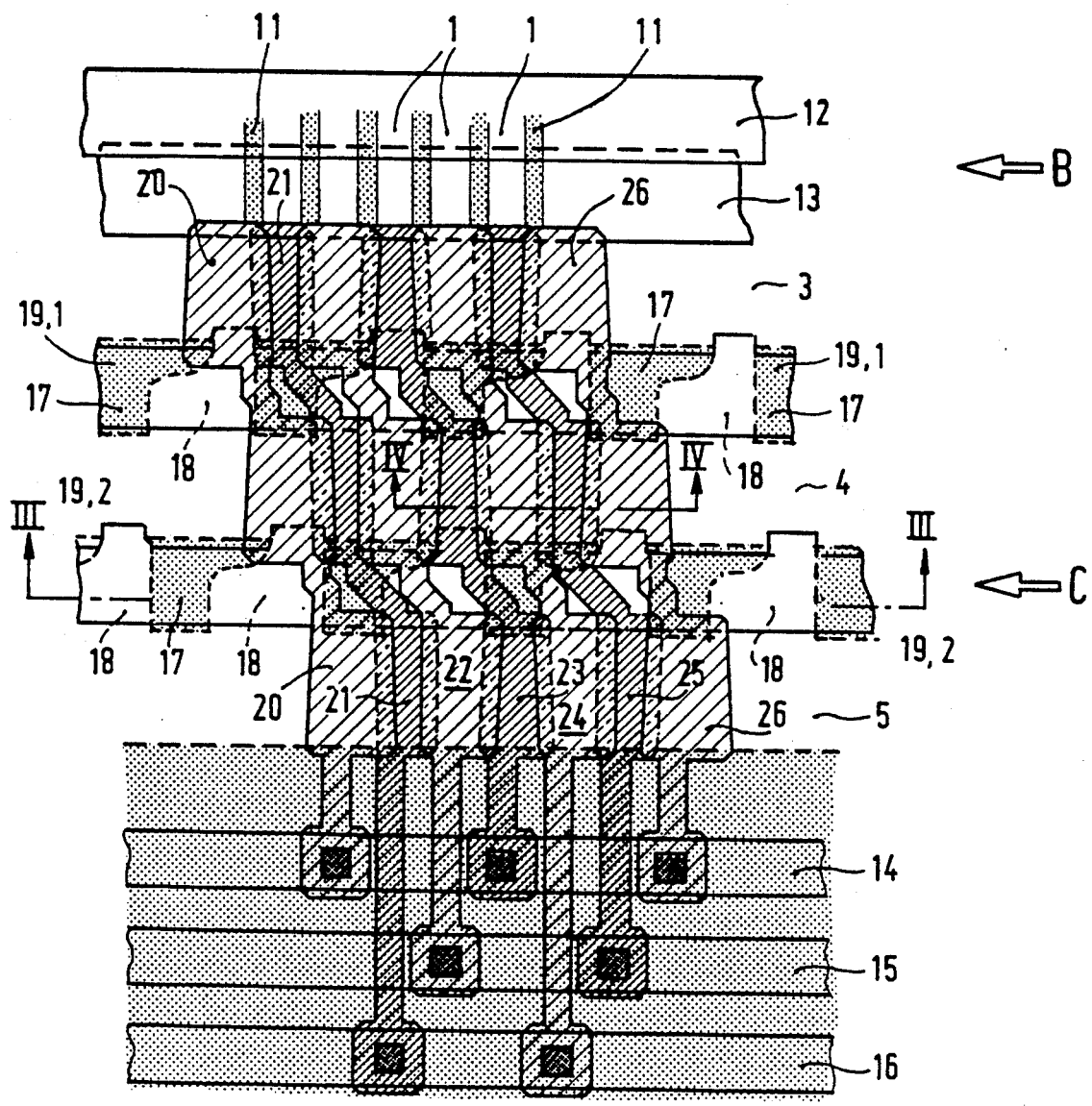
FIG. 2 shows diagrammatically a plan view of a part of the horizontal read-out registers in an FT sensor according to the invention.
Figure 4:
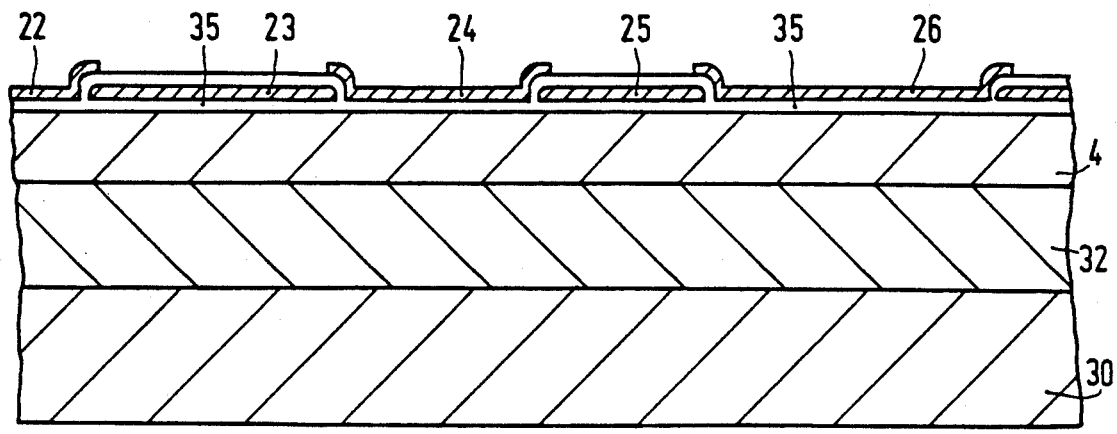
FIG. 4 is a cross-section taken on the line IV—IV in FIG. 2.

FIG. 2 is a plan view of a part of the horizontal read-out register C according to the invention. For explanation of the construction of the circuit arrangement, FIGS. 2 and 4 show two sectional views taken on the lines III—III and IV—IV respectively FIG. 2 shows several vertical channels 1 at the transition between the B section and the C section. The channels 1 are mutually separated by channel-limiting regions 11, which for the sake of clarity are indicated in grey in the drawing. Further, the charge storage electrode 12 and the transfer electrode 13 are shown in the drawing. The electrodes both of the sections A, B and of the section C can be constructed in known manner as a wiring system comprising three polycrystalline silicon layers, the electrode 13 being provided in the first polycrystalline silicon layer and the electrode 12 being provided in the second polycrystalline silicon layer. As appears from the drawing, the electrodes are arranged so as to overlap each other in such a manner that adjacent electrodes overlapping each other are insulated from each other by intermediate oxide layers (not shown) or layers of another dielectric material. The different polycrystalline silicon layers will briefly be designated hereinafter in the order of succession in which they are provided as poly I, poly II and poly III.

The horizontal registers of channels 3, 4 and 5 in this embodiment constitute a 3-phase CCD. It will be appreciated without further explanation that these registers may also be constructed as 2- or, for example, as 4-phase CCD's. The clock voltages are supplied via three clock lines 14, 15 and 16, which are constituted, for example, by Al tracks and are each contacted with the poly electrodes of one of the three phases. The horizontal channels 3 are mutually separated by channel limiters 17 (indicated in grey, like the zones 11). For the transport transverse to the longitudinal direction on behalf of the distribution of charge packets over the three channels, in the channel limiters 17 channels 18 are left free, through which charge can be transported from the channel 3 to the channel 4 and from the channel 4 to the channel 5. In the drawing, the limit between the transverse channels 18 and the channel limiter 17 is indicated by broken lines. Transfer gates 19,1 and 19,2 are provided above the channel limiters 17 and the transverse channels 18 and these gates define charge storage gate sites in the subjacent part of the transverse channels 18. These gates, which are made of poly I, have at the area of the transverse channels 18 small projections serving to improve the transport to the transverse channels 18, as described inter alia in European Patent Application EP-A 0,125,732 (PHN 10,676), laid open to public inspection on 21-11-1984 in the name of the applicant.

In contrast with the embodiment shown in the aforementioned publication, in which the transverse channels 18 extend obliquely with respect to the longitudinal direction of the transfer gates 19,1 and 19,2, the transverse channels in the present embodiment extend practically at right angles to the longitudinal direction of the transfer gates. Thus, the advantage is obtained that the distance over which the transverse transport must take place is as short as possible. As further shown in the drawing, the transverse channels or connections 18 become wider from top to bottom in such a manner that on the lower side a charge storage side can be formed, in which the charge packets can be stored before they are transported to the adjoining horizontal channel.

The clock electrodes of the horizontal register C extend between the clock lines 14–16 and the B section in a direction transverse to the charge transport direction of the horizontal channels 3, 4 and 5. The electrodes 20, 22, 24, 26, which are made of poly III, and the electrodes 21, 23, 25, which are made of poly II, extend transversely across the transfer gates 19,1 and 19,2 of poly I and overlap the transfer gate 13, which is also made of poly I. The electrodes 20–26 are provided in a usual manner through contact windows in a glass layer with the Al clock lines 14, 15 and 16.

As appears from the drawing, the electrodes 20–26 are relatively offset in the direction from the channel 3 to the channel 4 and from the channel 4 to the channel 5 each time over a distance of approximately one electrode, which permits moving the charge from one phase to another phase in the case of the transport through the transverse channels 18.

Figure 3:
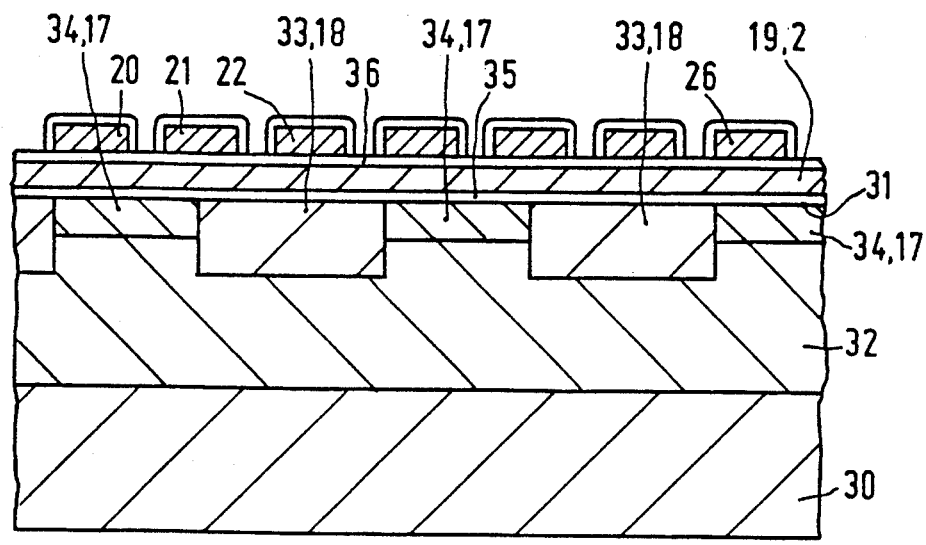
FIG. 3 is a cross-section of this arrangement taken on the line III—III.

For the sake of clarity, FIG. 3 shows a cross-section of the arrangement at the area of the transfer gate 19,2. By way of example, the arrangement comprises an n-type silicon substrate 30 provided at its surface 31 with a p-type surface region 32. In this p-type region are provided n-type surface zones 33, which constitute the transverse channels 18. The channels 18 are mutually separated by intermediate parts of the p-type region 32, whose p-type doping concentration at the area of the zones 34 may be increased, if desired, and which constitute the channel-limiting regions 17. The surface 31 is covered by a thin oxide layer 35, which constitutes a gate dielectric and on which the transfer gate 19,2 in the form of a polycrystalline silicon layer (poly I) is provided, by which the potential in the channels 18 can be adjusted. The gate 19,2 is covered by an oxide layer 36 or a layer of another suitable dielectric, which insulates the gate 19,2 from the electrodes 20–26.

FIG. 4 shows a cross-section along a part of the horizontal channel 4. This channel is constituted by an n-type zone formed in the p-type region 32 and having the same composition as the transverse channels 18. The thickness and the doping concentration of these zones are chosen so that the device can be operated as a CCD of the buried channel type. The clock electrodes 23, 25 and 27 are formed from the poly II layer and are overlapped by the electrodes 22, 24, 26, which are formed from the poly III layer. When its width is concerned, the term "electrode" is to be understood hereinafter to mean that part of the electrode which is effective, i.e. that part of the electrode which depending upon the applied voltage determines the potential in the subjacent part of the channel 4. This means that those parts of the electrodes 22, 24, 26 which are formed from poly III, which overlap the electrodes 23, 25 etc. (poly II) and which therefore do not contribute to the potential variation in the channel 4, do not form part of the effective electrode width. The width of the effective electrodes 22, 24, 26 is determined only by a part of the electrodes which is located on the dielectric layer 35.

As appears from FIG. 2, the clock electrodes 20–26 not all have the same width, as is usual, but are dimensioned so that the electrodes 20, 23, 26 have a larger width at least on the side adjoining the transverse channels 18 than an intermediate storage electrode 21 and/or 22.

In a simple embodiment, the electrodes 20–26 can all take the form of a rectangle, the width of the electrodes 20, 23 and 26 being larger than that of the electrodes 21, 22, 24, 25 etc. However, in the present embodiment, the electrodes 20–26 have on the upper side substantially the same width and the width of the electrodes 20, 23, 26 etc. gradually increases in downward direction at the expense of the width of the electrodes 21, 22, 24, 25.

Figure 5:
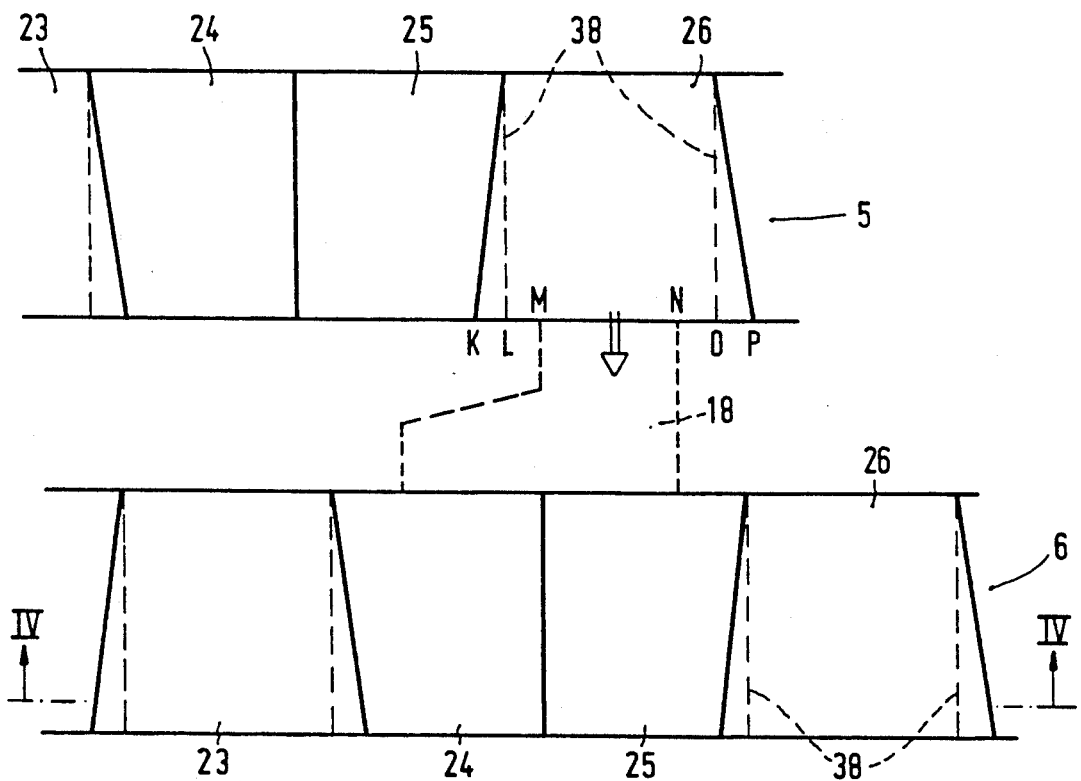
FIG. 5 shows diagrammatically a plan view of a part of two adjacent horizontal registers and an intermediate transverse connection on an enlarged scale.

The effect of the geometry of the electrodes is illustrated in FIG. 5. In this Figure, the electrodes 23–26 are shown diagrammatically above the channels 5 and 6 and one of the transverse channels 18. In the drawing, only the effective electrodes are shown. Overlapping parts are not shown for the sake of clarity. The broken lines 38 indicate the boundaries between the electrodes if they have a conventional rectangular geometry of relatively equal dimensions. In a specific embodiment, the width of the electrode 26, i.e. the distance between the points L and O, would then be 8 $\mu$m. Since a given distance, in this case about 1.5 $\mu$m, has to be maintained between the points L and O and the lateral boundary of the transverse channels 18, a width of about 5 $\mu$m is left for the transverse channel 18 on the side of the charge transport channel 5. This width is so small that in situ during the transport of charge from the channel 5 to the channel 6 narrow channel effects occur, which seriously impede the charge transport. When, as shown in the drawing, the electrode 26 is widened in such a manner that the width KP is about 10 $\mu$m the width MN of the channel 18 can be increased to 7 $\mu$m, while maintaining the same tolerance for the channel 18. This increase proves to be such that the transport problems described above can thus be entirely avoided.

The enlargement of the electrode is at the expense of the width of the remaining electrodes because the average pitch in each group of three electrodes must not change with respect to the pitch of the vertical registers 1. In order to reduce as far as possible the loss of charge storage capacity, the two remaining electrodes 24, 25 each have been made about 1 $\mu$m narrower down to a width of about 7 $\mu$m on the side of the transverse channel 18. On the upper side, i.e. on the side remote from the channel 18, the electrodes 24, 25 and 26 substantially have the same width of about 8 $\mu$m.

The electrode 26 becomes wider from top to bottom due to its trapezoidal shape. This shape has the advantage that an electric field is induced in the channel 5 and is directed so that electrons stored below the electrode 26 are pushed downwards in the direction of the transverse channel 18, as a result of which the transport from the channel 5 to the transverse channel 18 is favorably influenced.

It will be appreciated that the invention is not limited to the embodiment described here, but that within the scope of the invention many further variations are possible for those skilled in the art.

For example, the registers 4, 5 and 6 may also be constituted by 2-phase or 4-phase CCD's. The registers 4, 5 and 6 may be provided with an electrode system consisting of storage electrodes and transfer electrodes, the transfer electrodes having relatively the same widths and the charge storage electrodes corresponding to a transverse channel between the registers having a larger width than the remaining charge storage electrodes.

The invention may also be used in CCD's having only two horizontal registers interconnected through transverse channels.

Further, the invention may be used not only in image sensors, but also in other types of charge-coupled devices.

Instead of a device of the buried channel type, the charge-coupled device may also be of the surface transport type. The invention may further be used in all CCD arrangements having a parallel-IN-series-OUT configuration, such as sensors of the interlaced scanning type, line sensors and SPS memories, in which two or more adjacent output registers are employed.

What is claimed is:

1. A composite charge-coupled device having a semiconductor body comprising at least two adjacent parallel charge transport channels defined at a surface and having longitudinal parallel charge transport directions and two rows of clock electrodes provided on the surface and extending in the longitudinal direction of the charge transport channels for applying clock voltages for controllably storing information representing charge packets in charge storage regions in the charge transport channels and for transporting charge packets from one charge storage region to the next charge storage region, at least one transverse connection channel provided between the two charge transport channels, said connection channel being limited by channel limiting regions and via which charge packets can be transferred from a charge storage region in the first charge transport channel to the second charge transport channel, further comprising means for enhancing transverse interchannel charge transport from said first transport channel to said second transport channel via said connection channel and comprising the clock electrode associated with the charge storage region in the first charge transport channel being wider in the longitudinal direction at least on its side adjoining the connection channel than the clock electrode associated with an adjacent charge storage region in the first charge transport channel and being wider on the side adjoining the connection channel than on the opposite side thereof.

2. A charge-coupled device as claimed in claim 1, characterized in that said clock electrode is trapezoidal.

3. A charge-coupled device as claimed in claim 1, characterized in that the two adjacent charge transport channels are constituted by n-phase devices, while each group of n electrodes of the first charge transport channel contains a charge storage electrode, which corresponds to a connection channel and which has a larger width at least on the side adjoining the connection channel than the remaining charge storage electrodes in the same group, which have relatively equal widths.

4. A charge-coupled device as claimed in claim 1 or 2, characterized in that the first and the second charge transport channel constitute the read-out register of a bidimensional image sensor.

* * * * *